United States Patent
Waldstein et al.

(10) Patent No.: US 7,112,990 B2
(45) Date of Patent: Sep. 26, 2006

(54) PHYSICAL LAYERS

(75) Inventors: Steven M. Waldstein, Scarborough, ME (US); Maurice Richard, Gorham, ME (US); Alexander Alexeyev, Yarmouth, ME (US); David Reynolds, Scarborough, ME (US)

(73) Assignee: Tundra Semiconductor Corp., (CA)

( * ) Notice: Subject to any disclaimer, the term of this patent is extended or adjusted under 35 U.S.C. 154(b) by 0 days.

(21) Appl. No.: 10/759,756

(22) Filed: Jan. 16, 2004

(65) Prior Publication Data

US 2005/0024089 A1    Feb. 3, 2005

Related U.S. Application Data

(60) Provisional application No. 60/440,979, filed on Jan. 17, 2003.

(51) Int. Cl.
*H03K 17/16* (2006.01)
*G11C 5/14* (2006.01)

(52) U.S. Cl. .............................. 326/32; 326/33; 326/34; 327/530; 327/534; 327/157

(58) Field of Classification Search ............ 326/32–34, 326/81, 121; 327/138, 132, 148, 147, 152, 327/155, 156, 210
See application file for complete search history.

(56) References Cited

U.S. PATENT DOCUMENTS

| 5,184,129 A | * | 2/1993 | Fung et al. ................. 341/144 |
| 6,462,588 B1 | * | 10/2002 | Lau et al. ................... 327/108 |
| 6,573,779 B1 | * | 6/2003 | Sidiropoulos et al. ....... 327/345 |

* cited by examiner

*Primary Examiner*—Vibol Tan
(74) *Attorney, Agent, or Firm*—Blakely, Sokoloff, Taylor & Zafman LLP

(57) ABSTRACT

Improvements to the physical layer are provided, for example a test circuit that does not introduce further skew into critical clock signals. A boundary scan test circuit is also provided used to isolate an integrated circuit for applying test vectors or circuit brand connections to test the integrity thereof. A bias voltage generator for a voltage controlled delay line (VCDL) is also provided.

4 Claims, 14 Drawing Sheets

Plurality of Stripes

Basic Delay-Locked Loop (DLL)

Basic Phase-Locked Loop (PLL)

Operational Amplifier

Operational Amplifier with Bias Control

PHYSICAL LAYERS

This application is related to and claims the benefit of the filing date of provisional U.S. Patent Application Ser. No. 60/440,979, filed Jan. 17, 2003.

FIELD OF THE INVENTION

This invention relates to network computing systems, and particularly to the physical layer of the hierarchy in a network computing system.

BACKGROUND OF THE INVENTION

It is the nature of the computer system development industry to require an exponential performance advantage over the generations while maintaining or decreasing system costs. In particular, telecommunications and networking computing systems additionally benefit from a reduction in the board size and an increase in system capabilities.

Computer system processors and peripherals continually benefit from the aforementioned generational performance advantage. This phenomenon is driven by improvements in process technology. In order to realize a proportional system wide improvement in performance, the connection fabric must improve along with the improvements in processors and peripherals.

A hierarchy of shared buses is a common fabric structure. Levels of performance required for the multiple devices in the system typically differentiate this hierarchy. A given bus is associated with one such level. Bus bridges connect the buses. In this structure a low performance device does not burden a high performance device.

This type of structure benefits from an increase in bus frequency, a wider interface, pipelined transactions and out of order completion capability. However, these techniques are well known, and are exploited to their full potential. Further increases in bus width will reduce maximum bus frequency due to skew effects i.e. as the data-path is altered to include a greater number of data bits, the skew, between those individual bits, originating in the transmission medium, becomes increasingly severe. A wider bus will also increase pin count. This will affect cost, and limit the interfaces on a device.

Furthermore, the maximization of bus frequency and width is incompatible with a many-device connection. Finally, it would be advantageous to increase the number of devices capable of direct communication.

Therefore, point to point, packet switched, fabric architectures have emerged as an alternative to the aforementioned bus structures. Such an architecture is beneficial in network equipment, storage subsystems and computing platforms. Networks of this architecture transmit encapsulated address, control and data packets from the source ports across a series of routing switches or gateways to addressed destinations. The switches and gateways of the switching fabric are capable of determining from the address and control contents of a packet, what activities must be performed. The architecture is capable of providing an interface for processors, memory modules and memory mapped I/O devices.

In a typical packet switched interconnect, the functionality is organized into a hierarchy of multiple layers. The disposition of typical layers apportions the functions most related to control and compatibility to the highest layers. The most rudimentary and device oriented considerations are apportioned to the lowest layer. The physical layer is the lowest or most physically fundamental layer.

Physical layer specifications define the interface between devices including packet transport mechanisms, flow control, and electrical characteristics.

For a packet switching network to be highly efficient, the physical layer of the network must strive to meet certain criteria, and for functions of the physical layer to be efficiently carried out.

Specifically:

The transmitter and receiver must establish the data integrity of the channel, and ideally should do so without additional hardware or cumbersome handshaking.

The physical layer should incorporate boundary scan testing in a manner that does not unnecessarily skew time sensitive signals i.e. clocks.

Should the physical layer incorporate delay lines, no significant jitter should be introduced due to variances in the manufacturing process.

Should the network define words that are multiple bytes in length, any corresponding word or byte frame signals, ideally do not require handshaking or additional pin count for synchronization.

Should a physical layer receive clock incorporate multiple delay lock loops (DLLs) for synchronizing with a transmit clock, it should be possible to allow adjustments of a fraction of the finest delay lock loop.

The problem with addressing these issues with 0.13_m CMOS is that the power supply voltage is 1.2V and this creates a real problem for the non logic designer as most of the techniques used in 3.3V or even 2.5V such as cascoding current sources (to improve output impedance and gain of circuits) either do not work well (or do not work at all).

In many kinds of circuits, there is a fundamental set of contradictory requirements: high speed operation, rail to rail inputs and or outputs, and low voltage operation. Some examples of these are: DLLs, PLLs, charge pumps, op amps, IO pads. In all these cases, the biasing is done with current sources and circuit performance is often limited by these current sources.

There is a need for improvements in the physical layer of a packet switched fabric, to address these concerns, in order to ensure that the fabric is highly efficient. In particular there is a need for increased co-ordination and synchronization between transmission and reception interfaces while maintaining a minimum increase in pin count, clock skew, and cycle overhead.

In particular, at 0.13 um, the power supply voltage is 1.2 V. This present a real problem for a designer of circuits that are not logic circuits because typical techniques used in 3.3 V or even 2.5 V domains either do not work well or do not work at all. For example cascading current sources to improve output impedance and gain circuits. Part of the problem is that in many kinds of circuits there are fundamentally contradictory requirements, such as high speed operation, rail-to-rail inputs and/or outputs, and low voltage operation. For example, these circuits include delay lock loops (DLL), phase lock loops (PLL), charge pumps, operational amplifiers (Op Amps), input/output (I/O) pads.

SUMMARY OF THE INVENTION

This invention addresses the need for improvement in the physical layer of a packet switched fabric communication system such that the fabric is highly efficient. A packet switched fabric communication system has a switch, communications medium and a number of end points. The switch and end points incorporate ports. In network hierarchy, the physical layer is responsible for packet delivery; Improvements to operation of ports falls within improvements to the physical layer.

The improvements can be better understood by enumerating the advantages and embodiments:

It is an advantage of the present invention to overcome the need for handshaking or additional pin counts used in testing the transmission data integrity of a bus. This first advantage derives from an apparatus for testing the integrity of a data message. This apparatus is an alternative to a handshaking routine or the use of a circuit that employs dedicated bus signals.

In a high-speed data bus system, maximum performance requires the skew of each bit of the data line to be adjusted to optimize the moment of the transmission cycle in which data sampling occurs. In order to achieve this optimization, the bus is 'trained'. As a pre-amble to operation, the delay associated with each line is varied and tested iteratively until the best possible delay is found. It is necessary to test the performance of this high-speed bus and identify errors.

In a corresponding embodiment, a physical layer is disclosed including: a transmitter incorporating one pseudo-random bit-stream generator for generating test vectors, a receiver incorporating a second pseudo-random bit-stream generator and a comparator; where the receiver uses the comparator to compare received test vectors to locally generated test vectors.

It is an advantage of the present invention to incorporate a test circuit that does not introduce further skew into critical clock signals. In the art, boundary scan signals are multiplexed with system signals in order to test integrated devices. However direct incorporation of scan signals into a clock multiplexed node may unnecessarily load the clock, creating a skew.

In a corresponding embodiment a multiplexing circuit is disclosed having: two tiers multiplexing, the first tier multiplexing a boundary scan signal with a set of clock grouped signals, the second tier selecting a first tier output on the basis of the clock.

It is an advantage of the present invention to incorporate DLL delay lines in the physical layer, while introducing no significant jitter due to variances in the manufacturing process. Manufacturing variances between n and p type transistors may cause unbalanced pullup and pulldown behavior in a bias circuit that ultimately results in DLL jitter.

We introduce a device to adjust the current as a function of process, voltage and temperature. The device is a current bleeder.

In a corresponding embodiment a physical layer segment is disclosed including a delay line generator comprising: a voltage control input, independent positive and negative bias generators with dedicated positive and negative bandgap references, wherein each of the generators is complementarily responsive to variances in the properties of internal n and p type transistors.

The nature of the improvements involves superior co-ordination, synchronization while maintaining a minimum increase in pin count, clock skew, and cycle overhead.

DETAILED DESCRIPTION OF THE PREFERRED EMBODIMENT

Figure 1:
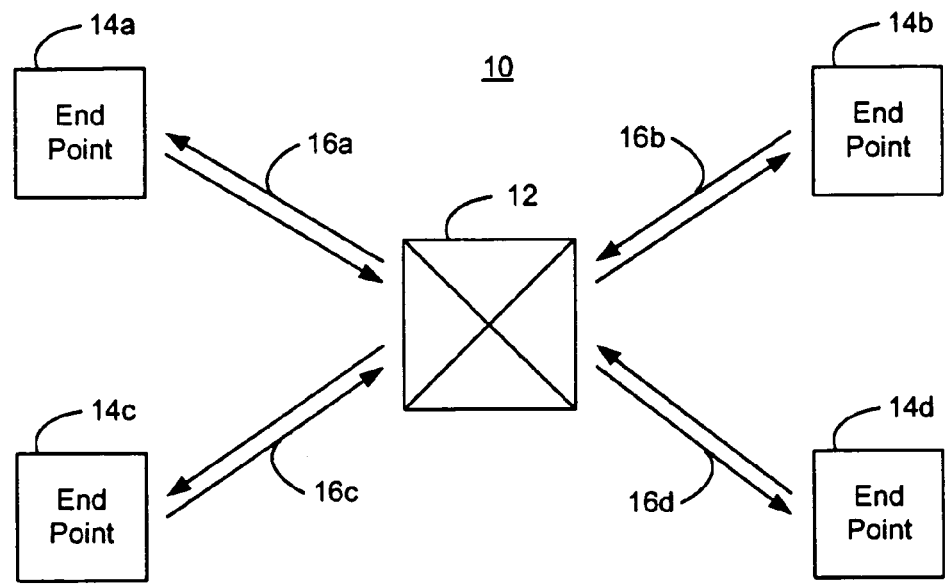
FIG. 1 is a block diagram of a system of the prior art.
Figure 2:
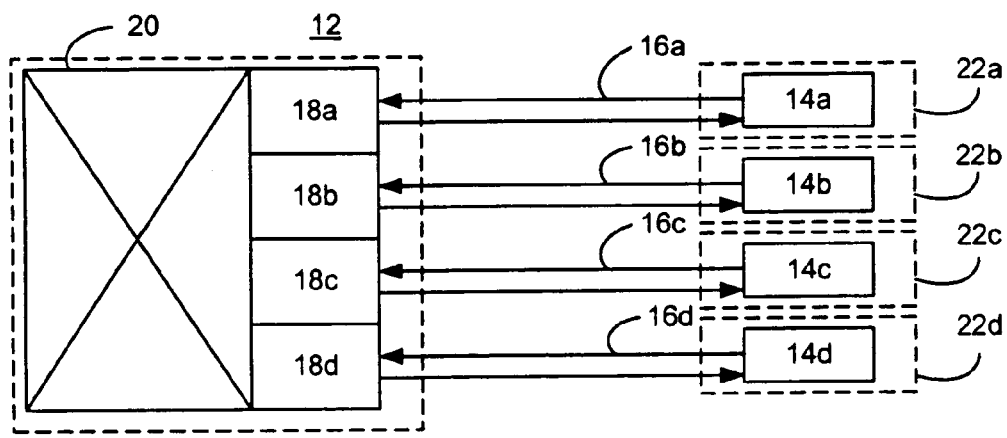
FIG. 2 is a block diagram of a system of the prior art.

Referring to FIG. 1, 2 there is illustrated, in a block diagram, a packet based switching system of the prior art. The switching system 10, includes a switch fabric 12 and end points 14a–14d, connected to the fabric 12 by channels 16a–16d. The fabric core 20 is connected to the channels 16a–16d by ports 18a–18d. The end points are connected to the channels by ports 22a–22d. Note that although 4 ports are shown, the number of ports is not fixed. A regional view of the fabric 12 includes the fabric core 20 and the ports 18a–18d.

Figure 3:
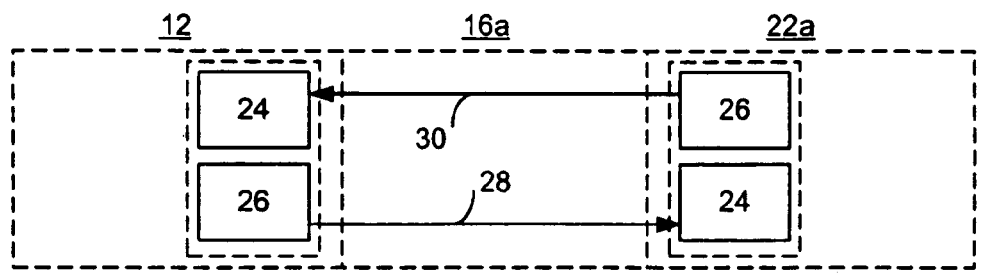
FIG. 3 is a block diagram of an endpoint of the prior art.

FIG. 3 shows greater detail of a single endpoint 14a and the respective portion of the fabric 12. The end point 14a is connected to the fabric 12 via channel 16a. Both the fabric and endpoint contain ports 18a and 14a, respectively, for coupling to the channel 16a. The channel 16a is a duplex channel containing an upstream channel 30 and a downstream channel 28. The port 22a contains transmitter 24 and receiver 26 for cooperating with the upstream channel 30 and downstream channel 28, respectively.

Figure 4:
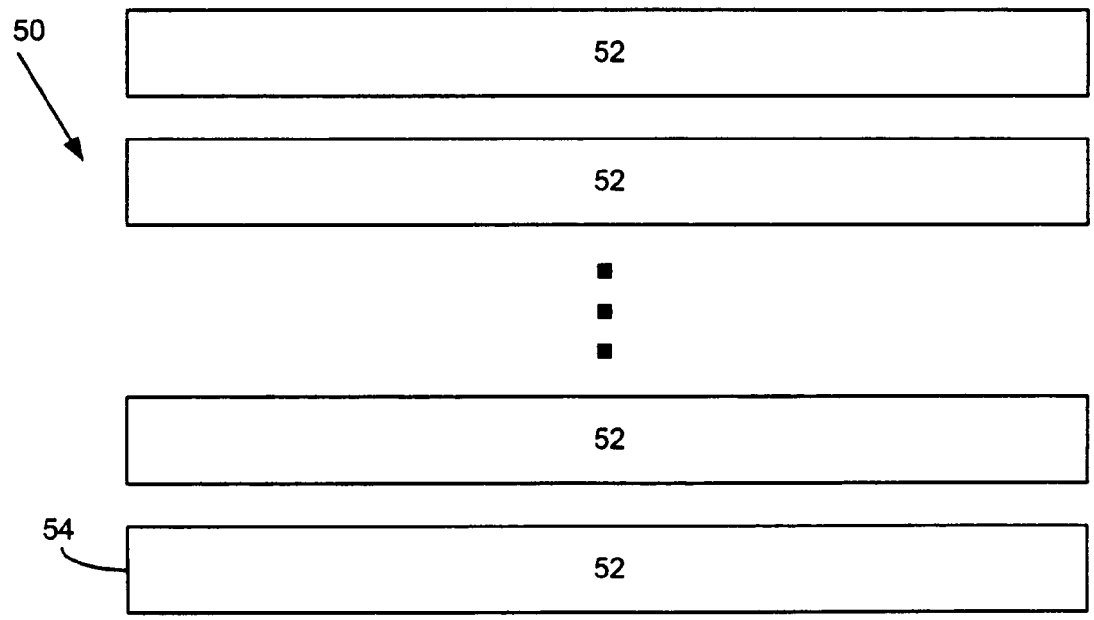
FIG. 4 is a block diagram of a network hierarchy of the prior art.

The operation of a network communication system over such a switching system 10 is accomplished through the specification of a network hierarchy. Referring to FIG. 4 there is such a network hierarchy 50 consisting of a number of specification layers 52. Although 4 or more layers are shown there is no limitation on the number of layers. Conventionally, in such a specification the lower most, or most physical, layers define the device interfaces, packet transport mechanisms, flow control and electrical characteristics. The higher layers will define addressing, transaction protocol, and interface with the communication system. Throughout the remainder of the disclosure we refer to the lowest layer 54 as the physical layer. Further the operation of the ports 14a–14d, 18a–18d, transmitters 24, and receivers 26 are specified in this convention by the physical layer 54.

Figure 5:
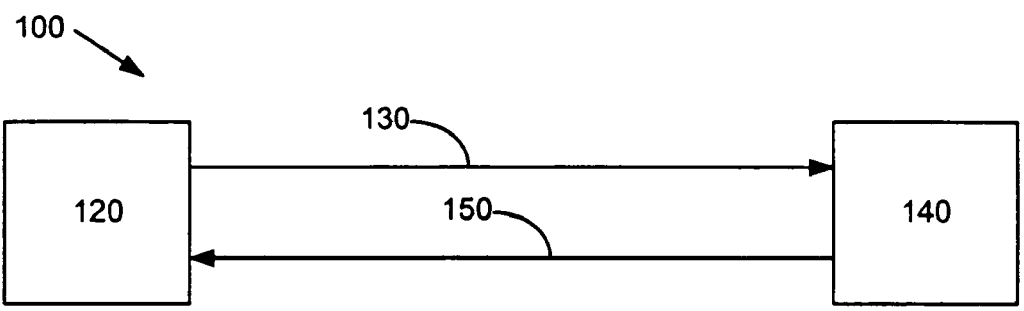
FIG. 5 is a block diagram of a handshaking system of the prior art.

One aspect of the physical layer is the co-ordination of transmission and reception. Typical prior art co-ordination involves handshaking. Referring to the block diagram of FIG. 5 is a handshaking system 100 including a channel under test 130, similar to channels 28,30, and corresponding test apparatus including the transmitter 120, the receiver 140, and a back channel 150. The back channel 150 may be dedicated, or may be the return data channel of an associated duplex system.

Figure 6:
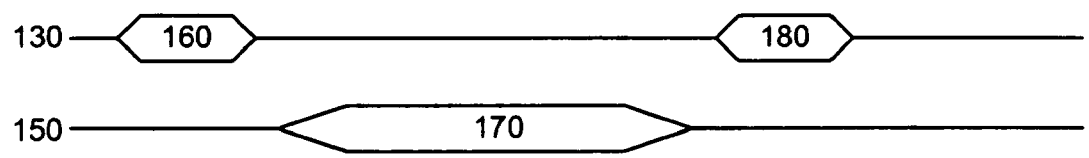
FIG. 6 is a timing diagram of a handshaking system of the prior art.

Referring to the timing diagram in FIG. 6: A set of test vectors 160 is asserted on the test channel 130. The receiver retransmits reply test vectors 170 on the back channel 150. Finally the transmitter returns an error count 180 on the test channel. It is obvious that the error count 180, ideally, be transmitted on the test channel in such conditions conducive to correct transmission (e.g. lower frequency, high redundancy) rather than the conditions that are being tested. As an alternative, a dedicated channel may exist for this purpose. Similar considerations apply to the reply test vectors 170, if the back channel is the complementary channel of a duplex system.

Figure 7:
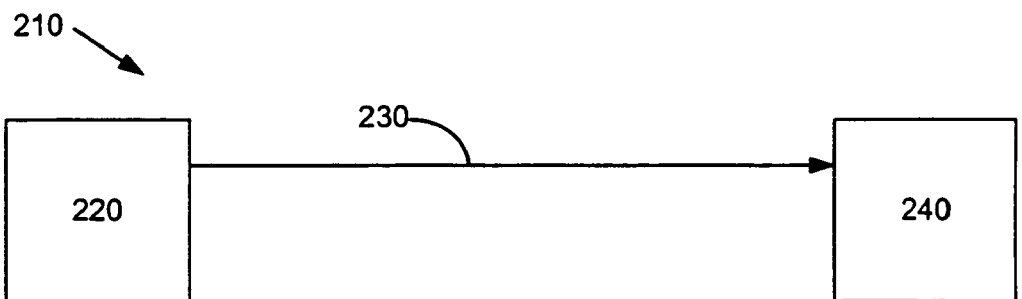
FIG. 7 is a block diagram of a co-ordination system.
Figure 8:
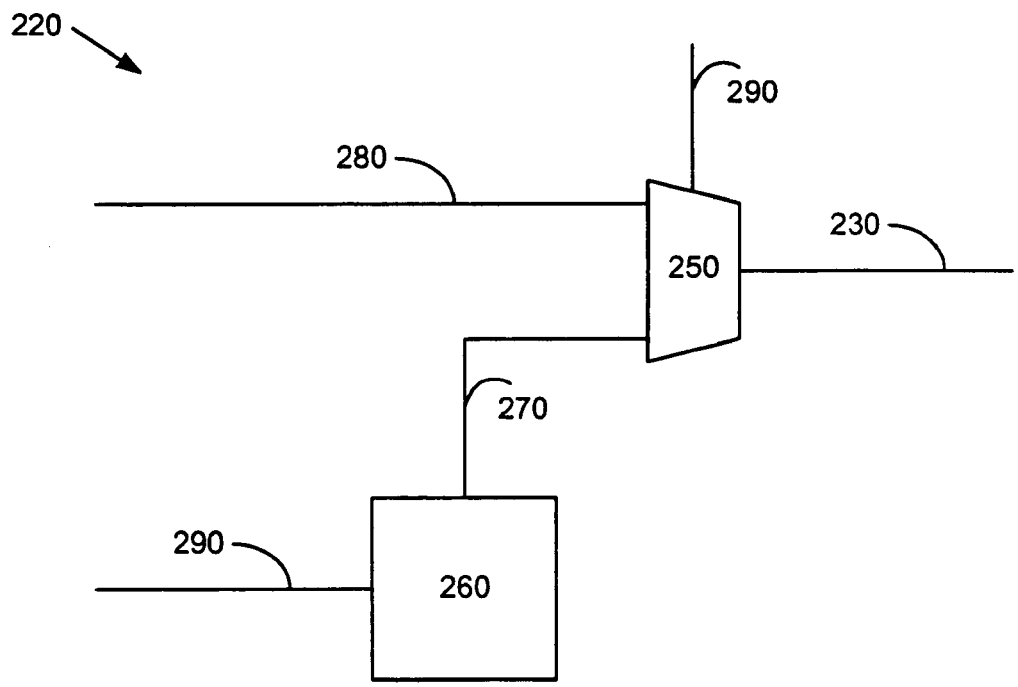
FIG. 8 is a block diagram of a transmitter.

In the inventive alternative, first, referring to FIGS. 7 and 8, we have a segment of the physical layer, a co-ordination system 210, comprising a transmitter 220, a channel under test 230, and a receiver 240. The transmitter 220 incorporates a multiplexer 250, the output of which is coupled to the channel under test 230. The transmitter also includes a pseudo-random binary sequence (PRBS) generator, 260. PRBS generator 260 is output coupled to multiplexer 250 input by composite test vector data output 270. The multiplexer also incorporates the input 280 of the transmitter 220. A test vector control line 290 is coupled to the control of the multiplexer 250 and to an input of the PRBS generator 260.

Figure 9:
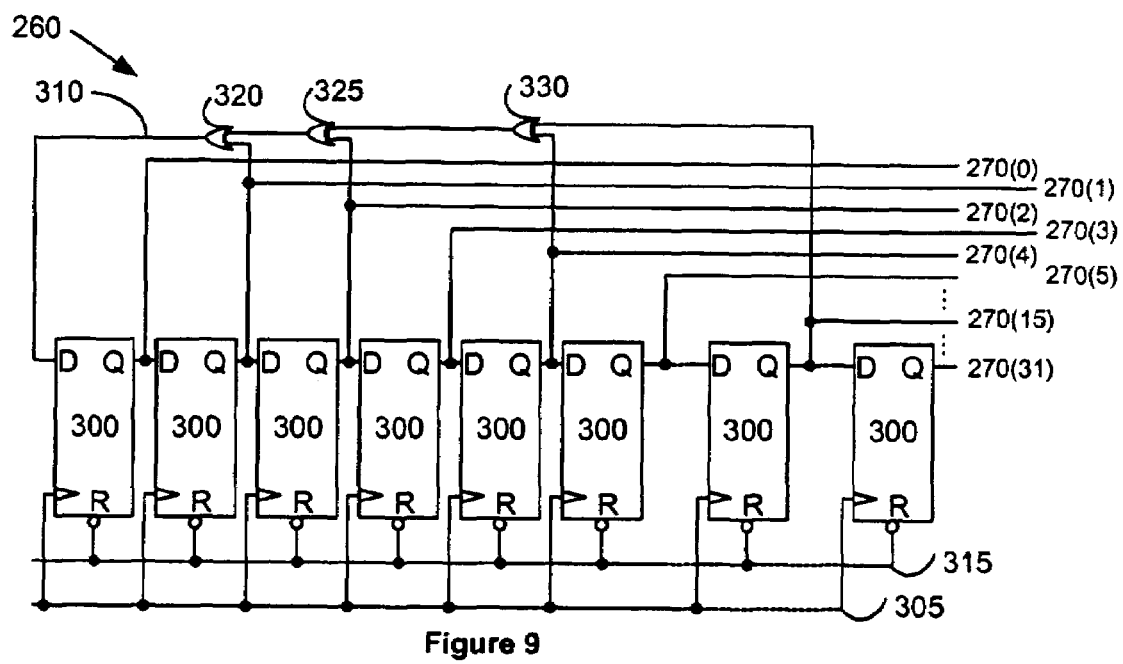
FIG. 9 is a block diagram of a Pseudo Random Bit Stream Generator.

Referring to FIG. 9, the PRBS generator 260 includes 32 shift registers 300 coupled in series. Each shift register, 300, is coupled to a one bit output 270(n) of a series of outputs 270(0 . . . 31) forming the composite test vector data output 270. The generator employs exclusive-or circuits, 320, 325, and 330, input coupled to the 2nd, 3rd, 5th and 16th bits of test data output 270. The output of these circuits is a seed 310 coupled to the first input of the series of registers 300. The shift registers 300 are all coupled to a common clock 305 and a common reset 315. Control line 290 is a logical precurser of the clock 305 and reset 315.

In operation, referring back to FIG. 8, the PRBS generator 260 PRBS generates test vector data (a pseudo-random sequence of test vectors 65,356 elements long, with longest runs of consecutive 1s or 0s over 2000) to be output on output 270. Such a level of randomness is sufficient to identify datapath errors. A test control signal, exerted on test vector control line 290 allows the multiplexor 250 to choose between data on input 280 or the test vector data. Further this control on line 290 may serve to signal the beginning of the pseudo random sequence. Those skilled in the art will understand circuits capable of coordinating this input 290 and the shift register reset 315.

Figure 10:
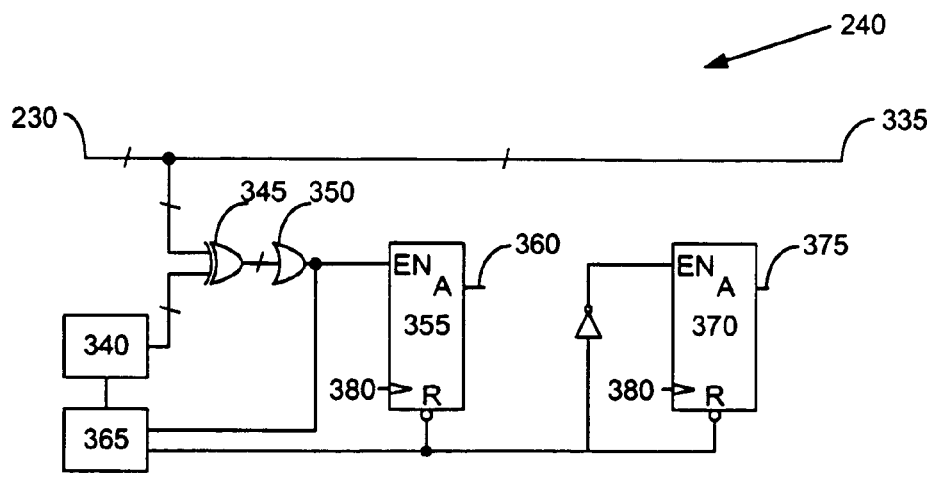
FIG. 10 is a block diagram of a receiver.

Referring to FIG. 10 we have a detailed expansion of receiver 240. The receiver 240 incorporates a receiver output line 335 coupled to the channel 230. The receiver 240 also incorporates a PRBS generator 340 identical to the PRBS generator in the transmitter 260. A bitwise XOR circuit 345 is input coupled to the generator 340 output and to the channel 230. The outputs of this circuit 345 are combined in OR circuit 350. The output of this, in turn, is coupled to the enable of counter 355. The counter is coupled to an error count line 360. The outputs of circuit 350 are also connected to the trigger 365. This trigger is coupled to the generator 340, to the reset of counter 355, and to a second counter 370 at the reset and at the enable (inverted). The output of the second counter 370 is coupled to the total count line 375. Both counters are coupled to a receiver clock 380.

In operation the generator 340 is held in a reset condition producing the first series vector. The vector output of the generator 340 undergoes a bitwise comparison with the incoming received data. When the initial vector is detected at the comparator 345 and 350, the trigger 365 releases the reset on the generator 340 and counters 355, 370 allowing the generator to produce the entire series for comparison, and allowing the counters to count the matches versus the total count.

Another aspect of the invention is an apparatus to incorporate a boundary scan test circuit into the physical layer while minimizing the amount by which this circuit reduces the performance of the transmitter or receiver. A boundary scan test circuit is used to isolate an integrated circuit (for applying test vectors to this circuit) or to isolate circuit board connections (to test the integrity of these connections).

In a multiple data rate bus system, there is a need to multiplex several data together for assertion on the bus, such assertion being controlled by the clock. There is also a need to include in the multiplexer, test data, if a boundary scan device is included. There is a need for a circuit that multiplexes all these signals, while maintaining the clock latency equivalent to a circuit without the boundary scan.

Figure 11:
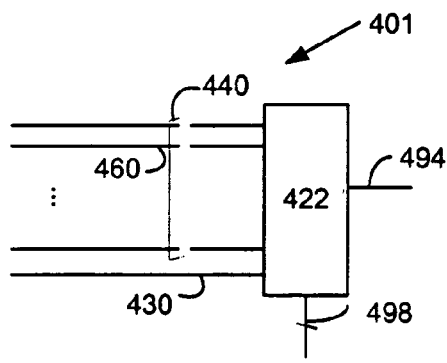
FIG. 11 is a multiplexing circuit according to the prior art.

Another aspect of the physical layer is the incorporation of boundary scan testing. Referring to FIG. 11, a prior art multiplexing circuit 401 is shown. It includes a selection multiplexer 422. This multiplexer 422 is coupled to the selection control line 498 and to the output 494 of the circuit 401. The inputs of the multiplexer are connected to a set 460 of non-test datums 440 and one test datum 430.

In operation the control line 498 selects one of the various data on the various data lines 460 and 430. This data may, for example, correspond to one boundary scan datum and many data to be asserted in non-test operations, but at different portions of the clock cycle. In this instance line 498 carries a composite test mode select/clock signal. This composition of the clock can generate unnecessary complications on a critical signal path.

Figure 12:
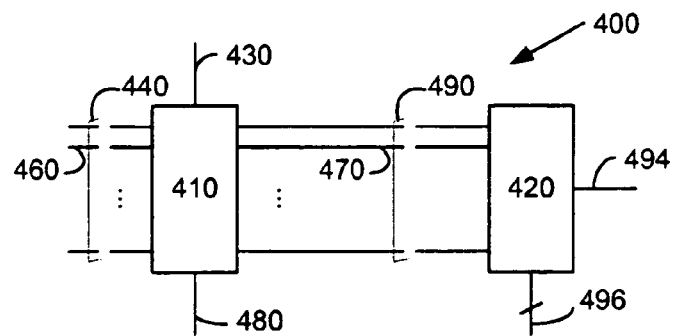
FIG. 12 is a multiplexing circuit.

In a second embodiment of the invention, referring to FIG. 12, a multiplexing circuit 400 is shown. It includes two multiplexing stages: an enabling stage 410, and a selection stage 420. The enabling stage 410 is a bank of single bit multiplexers each coupled to the test data line 430 and a single non-test datum line 460. The set of non-test datum lines are collectively the non-test data set bus 440. The test mode select line 480 is the multiplexing control coupled to enabling stage 410. Each multiplexor of the enabling stage 410 is output coupled to an intermediate datum line 470. The intermediate datum lines form an intermediate data set 490. This set 490 is coupled to the inputs of the selection stage 420. The output of the selection stage is the multiplexer output 494. The selection stage also is coupled to the selection control line 496.

In operation this multiplexer individually multiplexes the test data on the test line 430 with each datum line 460 according to the test mode line 480. The resultant multiplexed signals (asserted on intermediate lines 470) are again multiplexed according to the selection control line 496. This arrangement unburdens control line 496 from overhead. This consideration is critical if line 496 is a clock.

It can be understood from this description that the test and non-test data are multiplexed in a manner adding no additional latency to the select signal (or clock), than would exist in a simple circuit that multiplexed only non-test data.

A third aspect of the invention is an improvement in the generation of bias voltage for a Voltage-Controlled Delay Line (VCDL). A VCDL is a building block of a Delay-Lock Loop (DLL). The DLL, in turn is a circuit widely used in clock de-skewing, clock frequency synthesis, and high-bandwidth interfaces in the physical layer.

A prime design concern in the development of DLLs is the reduction of time-varying offsets in the output clock phase. This phenomenon is referred to as jitter. In one particular contribution to jitter, process variation between n and p type transistors, leads to variation in rise and fall times in the voltage control input of the VCDL. This will have a direct impact on the output phase. The object of this embodiment is to reduce or eliminate the process dependence in both the pull-up and pull-down bias of the voltage control. Further, this object is met without resorting to large capacitors, that would have an adverse effect on the footprint of this circuit.

Figure 13:
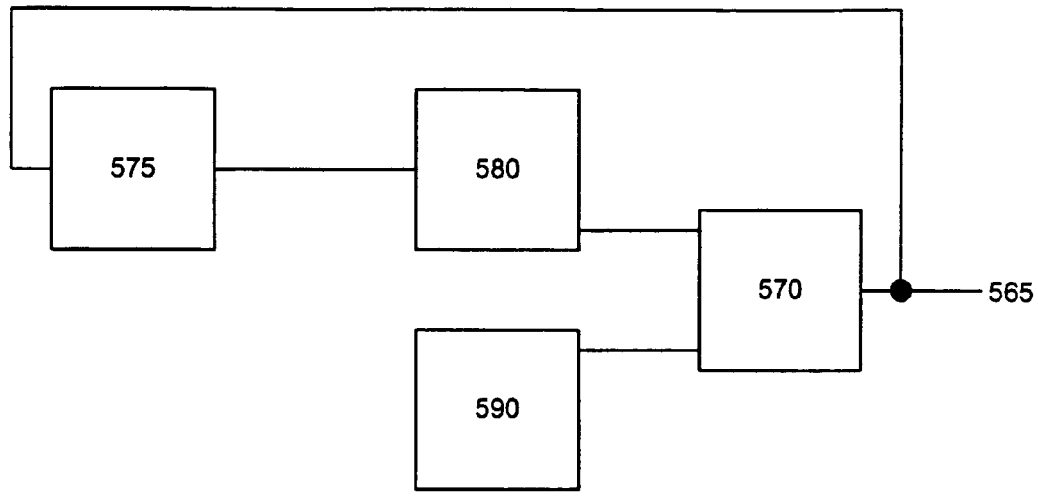
FIG. 13 is a block diagram of a DLL of the prior art.

Referring to FIG. 13 there is a block level arrangement of a known DLL 560. The Delay line 565 is the output of a bias generator 570. The line 565 is fed back to a phase comparator 575. The phase comparator is output coupled to a charge pump 580, in turn coupled to the bias generator 570. The bias generator is also coupled to a bandgap reference 590 as an input.

Figure 14A:
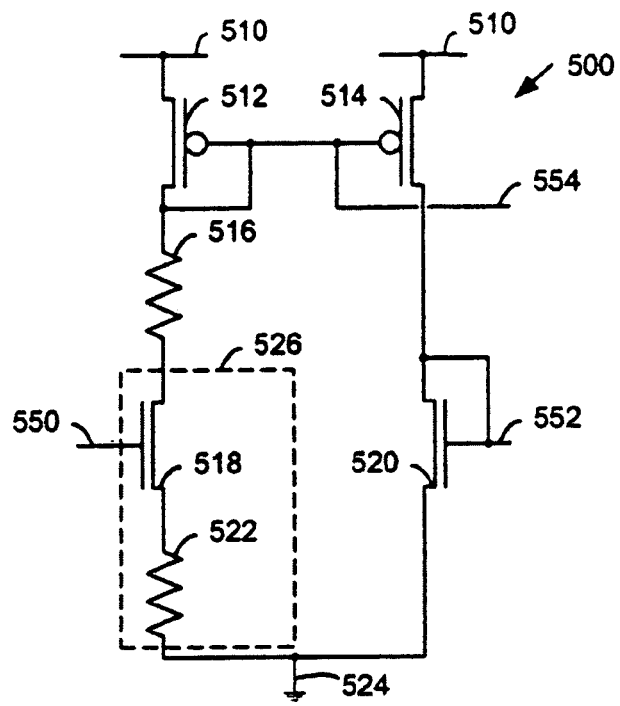
FIGS. 14a and b is a diagram of bias circuits and delay lines according to the prior art.

In FIG. 14*a*, a prior art voltage control bias circuit and VCDL is shown. In a circuit 500, delay lines consist of a positive bias line 554 and a negative bias line 552. The positive bias line 554 is coupled to a current mirror consisting of transistors 512 & 514. The negative bias line 552 is coupled to a current mirror consisting of a transistor 520. Transistor 512 is coupled via a resistor 516 to a voltage to current converter 526 formed of a transistor 518 and resistor 522. The circuit is biased by a lower voltage 524 coupled to resistor 522 and transistor 520 and a higher voltage coupled to the transistors 512 and 514. The input voltage 550 is coupled to transistor 518. The purpose of resistor 516 is to limit the maximum frequency of operation. Phase offset information is asserted as the charge pump voltage onto the input 550.

Figure 14B:
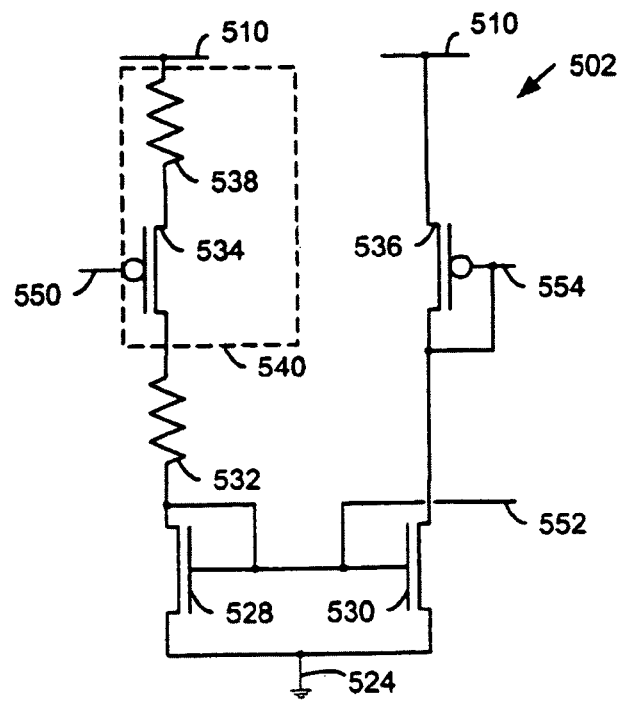

In FIG. 14*b* an alternative to circuit 500 is shown. A circuit 502 consists of a positive bias line 554 and a negative bias line 552. The negative bias line 552 is coupled to a current mirror consisting of transistors 528 & 530. The positive bias line 554 is coupled to a current mirror consisting of a transistor 536. Transistor 528 is coupled via a resistor 532 to a voltage to current converter 540 formed of a transistor 534 and resistor 538. The circuit is biased by a lower voltage 524 coupled to the transistors 528 and 530 and a higher voltage coupled to resistor 538 and transistor 536. The input voltage 550 is coupled to transistor 534. The purpose of resistor 532 is to limit the maximum frequency of operation. Phase offset information is asserted as the charge pump voltage onto the input 550. The difficulty with both the prior art bias circuits is a vulnerability to process mismatch distorting the response of the delay line. This contributes to jitter.

Figure 15:
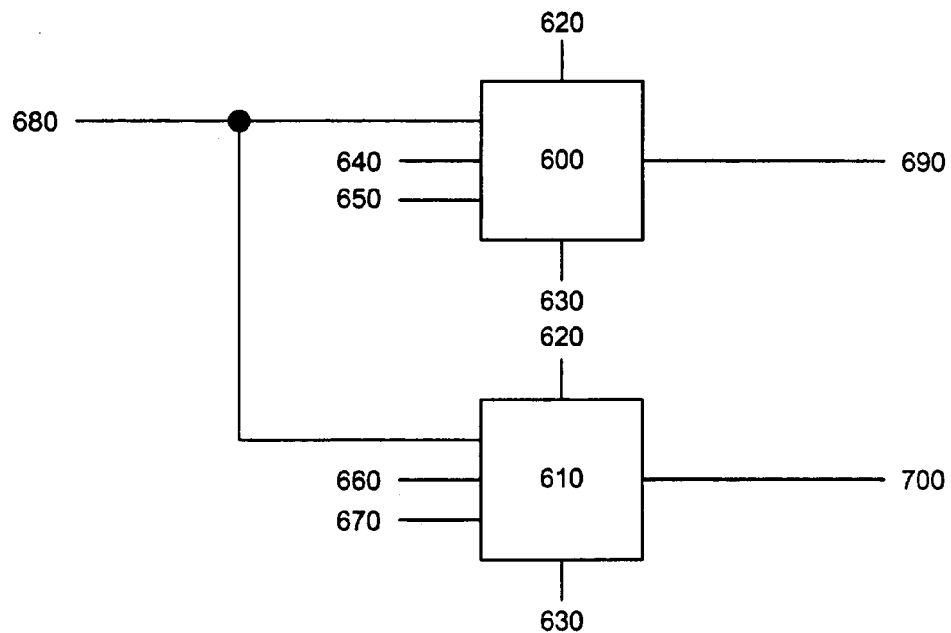
FIG. 15 is a diagram showing a bias circuit including a positive bias circuit and a negative bias accordance with an embodiment of the present invention.

Referring to FIG. 15, there is illustrated a bias circuit in accordance with a third embodiment. Bias circuit consists of two subcircuits a positive bias circuit, 600, and a negative bias circuit, 610. These circuits are biased by Vdd, 620, and Vss, 630. Temperature dependant voltage compensation is provided via the bandgap bias signals 640, 650, 660, and, 670. Phase offset information is asserted as the charge pump voltage, 680. The positive bias and negative bias circuits output is coupled, respectively, to a positive bias line, 690, and to a negative bias, 700 for the VCDL. The bias voltages of these lines are used to supply the delay element(s) of the VCDL in a manner similar to bias lines 552 and 554 of the prior art.

Figure 16:
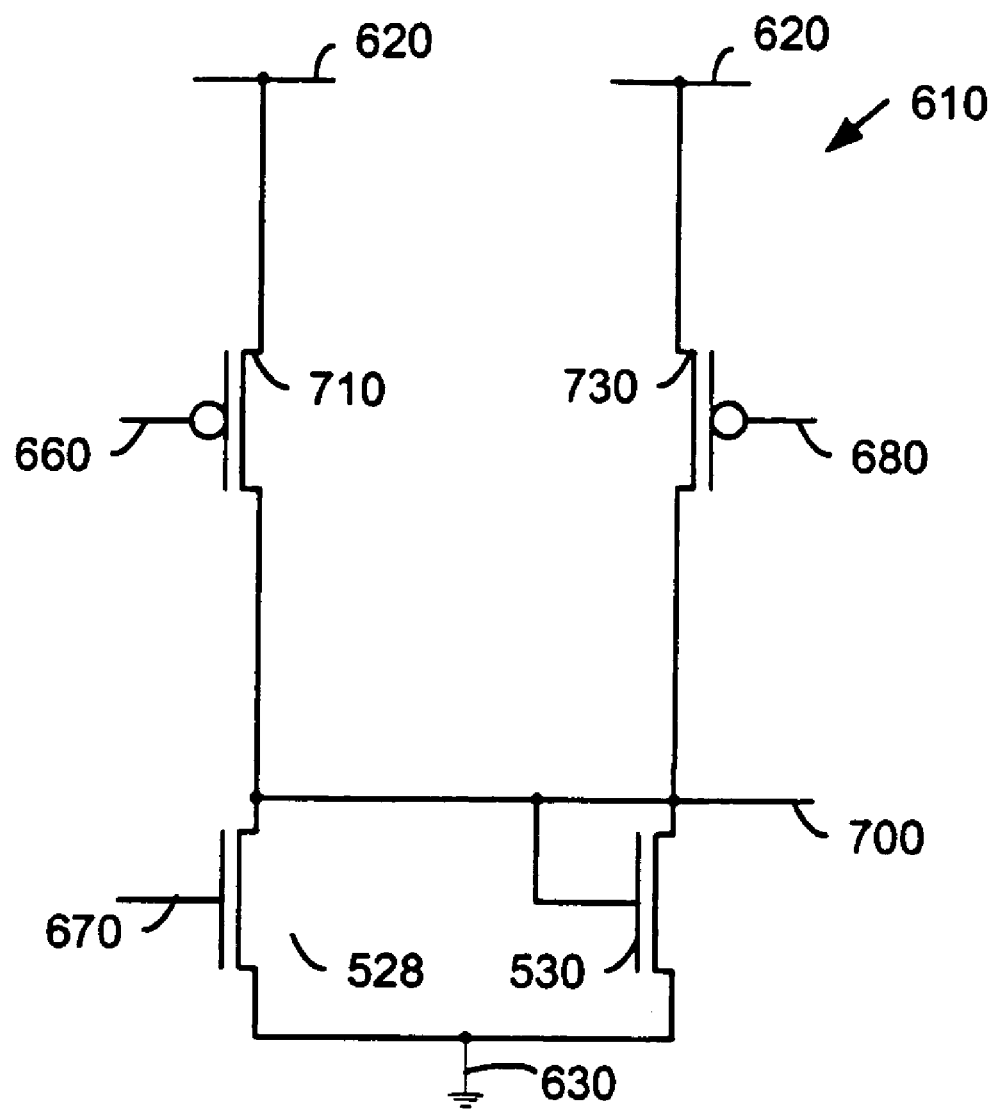
FIG. 16 is a diagram showing the negative bias circuit of FIG. 15.

Referring to FIG. 16, the negative bias circuit, 610, is detailed. Negative bias circuit, 610, consists of the main bias P channel device, 710. It is referenced to Vdd, 620, and its gate driven by the bandgap bias signal VBGP, 660. A weak bleeder N device, 528, referenced to Vss, 630, and its gate driven by the bandgap bias signal VBGN, 670. Also included is a current control device, 730, which provides current sweeping capability and as a result delay control of the VCDL. This device is also referenced to Vdd, 620, and is controlled by the charge pump voltage, 680. Under nominal conditions main bias P device, 710, provides most of the current to the positive bias circuit, 600, with the weak bleeder N device, 528, bleeding off excess current. When P doping is strong and N doping is weak, more current is provided by the P main bias device, 710, and less is subtracted by a weak bleeder N device, 720, resulting in larger current delivered to a biasing N current mirror. The opposite happens in the case of weak P doping, strong N doping. Less current is provided by the main bias P channel device, 710 and more current is subtracted by weak bleeder N device, 528, resulting in less then nominal amount of current delivered to the biasing N current mirror.

More specifically, a bleeder circuit is added to adjust the current as a function of process, voltage and temperature. The bleeder is sized with a minimum gate length and many short stripes and biased so that it does not draw much current at a slow (SS, hot, low temperature) corner, but draws more current at a fast (ff, cold, high temperature) corner. Since the bleeder circuit's current is subtracted from the current that goes to the delay cell, the bleeder circuit reduces the variation of the delay cell as a function of process, voltage and temperature (PVT).

Figure 17:
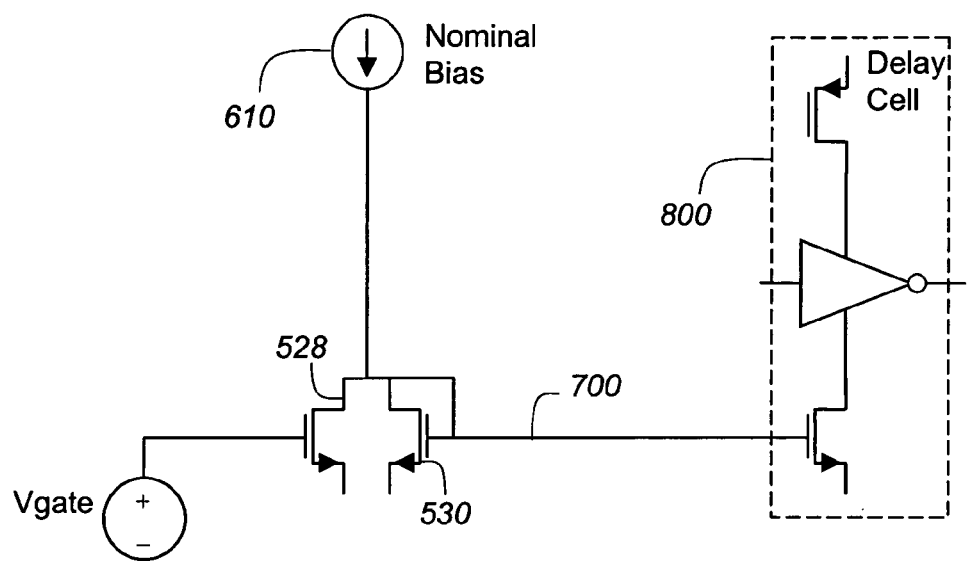
FIG. 17 is a diagram showing the positive bias circuit of FIG. 15 and a delay cell.

The Positive bias circuit, 600, is the complement of the negative bias circuit, 610, with respect to doping and reference biasing and is used to positively bias the VCDL. Referring to FIG. 17, the operation of the bleeder device of FIG. 16 is explained in further detail.

The bleeder of device 528 is sized (with minimum gate length and many short stripes) and biased so that it does not draw much current at slow (ss, hot, low voltage) corner, but draws more current at the fast corner (ff, cold, high temp). Since this current is subtracted from the current that goes to the delay cell 800, it reduces the variation of the delay cell verses PVT (a similar circuit using PMOS devices is used for the P bias). Notice also that this has the added benefit of adjusting for the odd process corners when the P and N devices do not track i.e. strong N, weak P and vice versa since they are adjusted independently.

The circuit behavior can be adjusted by both the sizing and the characteristics of Vgate. This means one can tune these two variables independently to minimize the overall circuit variation. The choice of minimum gate length and many short stripes for the bleeder device 528 is used to accentuate the variation in the characteristics of the bleeder device with process and improve its effectiveness for compensation.

While the bleeder device is shown for use with a delay cell, it will be appreciated that the bleeder device can be used with delay lock loops (DLL), phase lock loop (PLL), change pumps, op amps, and I/O pads.

Figure 18:
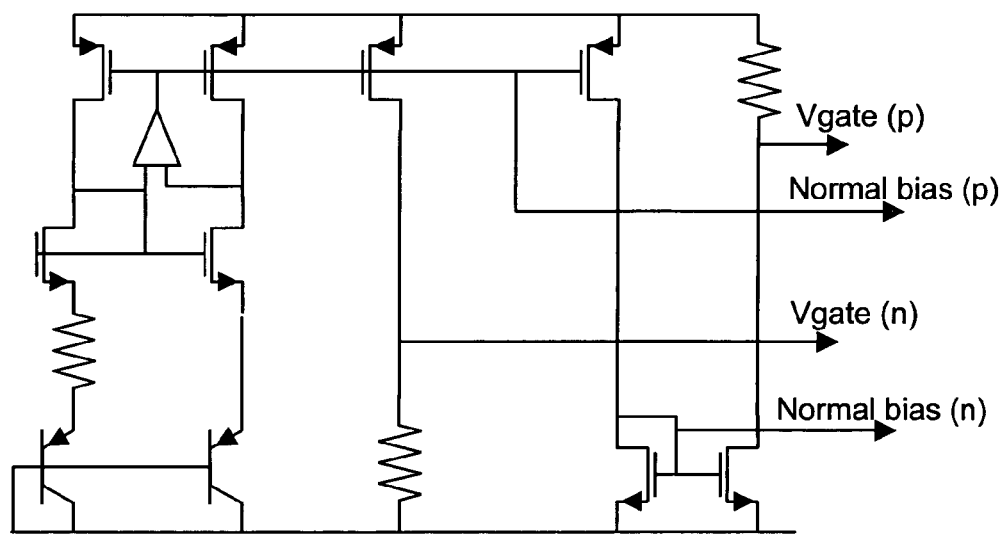
FIG. 18 is a diagram showing an implementation of the circuit of FIGS. 16 and 17.

Referring to FIG. 18, there is illustrated in a simplified schematic, an implementation of the bleeder device 528 for both positive and negative bias. By using a band gap, the circuit of FIG. 18 provides PTAT current, that to a first order helps to reduce template dependence of the current. The Vgate nodes are provided by resistors; which give a desirable instant voltage regardless of MOS processes.

Figure 19:
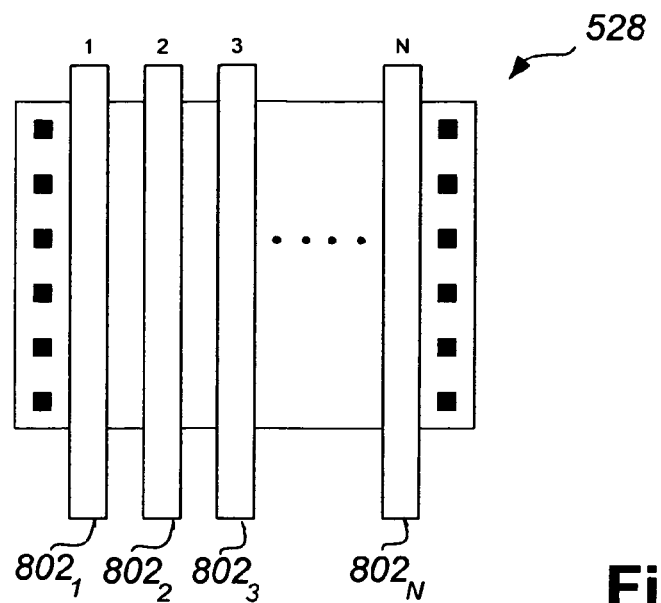
FIG. 19 is a diagram showing the gate structure of a transistor included in the bias circuit of FIG. 17.
Figure 22:
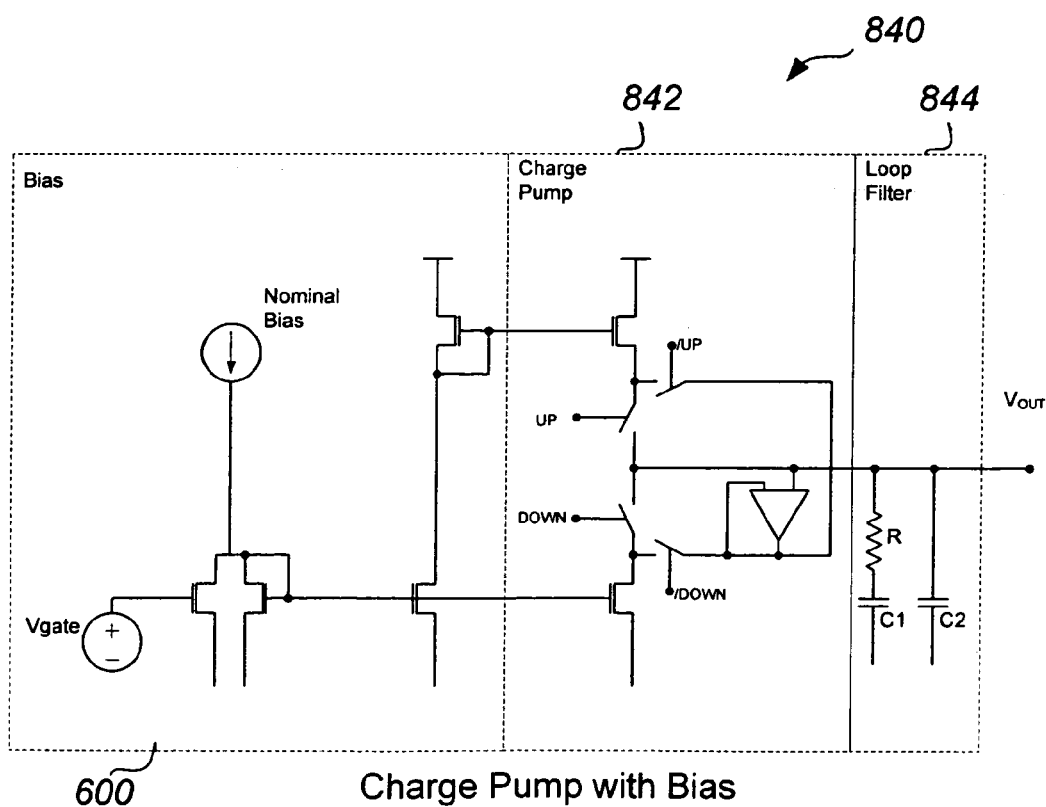
FIG. 22 is a diagram showing a charge pump with the bias circuit of FIG. 17.
Figure 20:
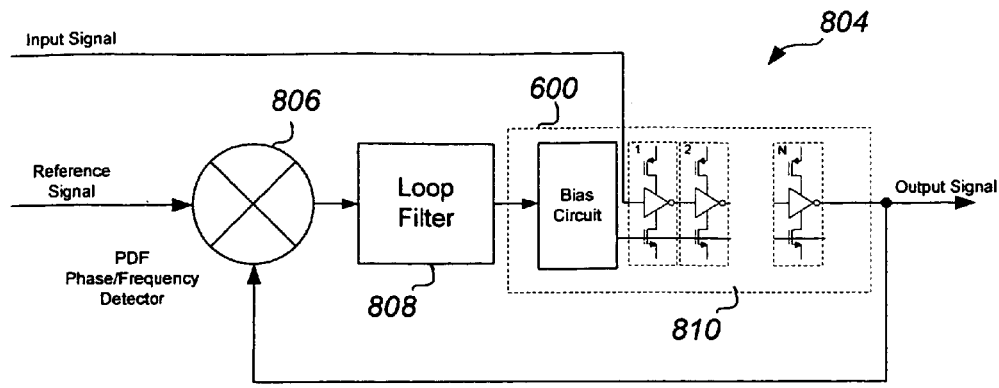
FIG. 20 is a diagram showing a delay lock loop (DLL) with the bias circuit of FIG. 17.
Figure 21:
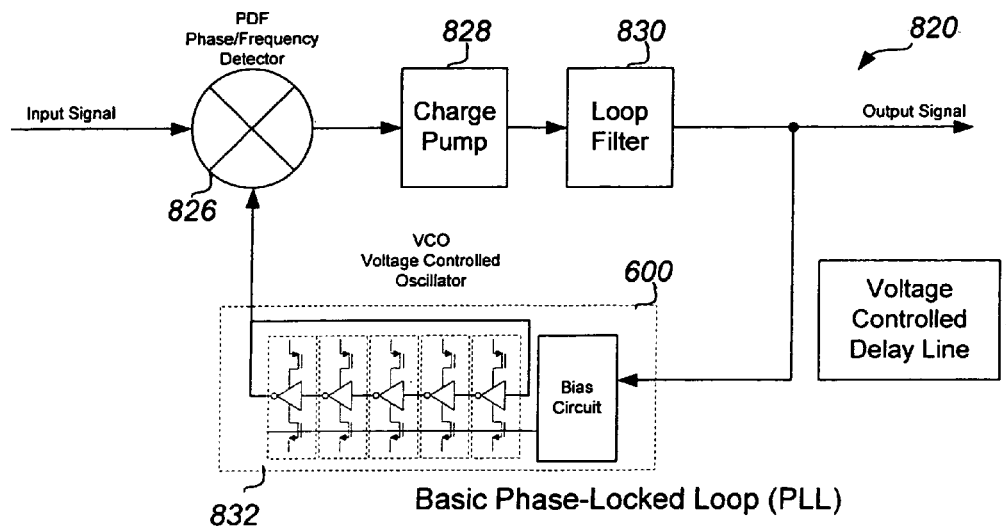
FIG. 21 is a diagram showing a phase lock loop (PLL) with the bias circuit of FIG. 17.
Figure 23A:
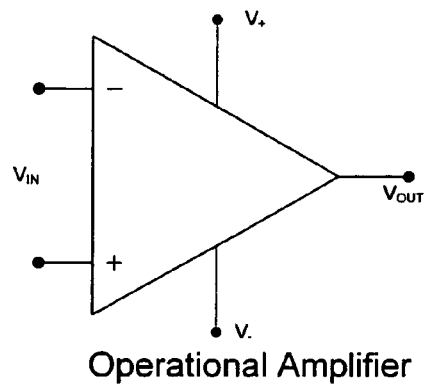
FIGS. 23a and 23b are diagrams showing an Operational Amplifier with the bias circuit of FIG. 17.
Figure 23B:
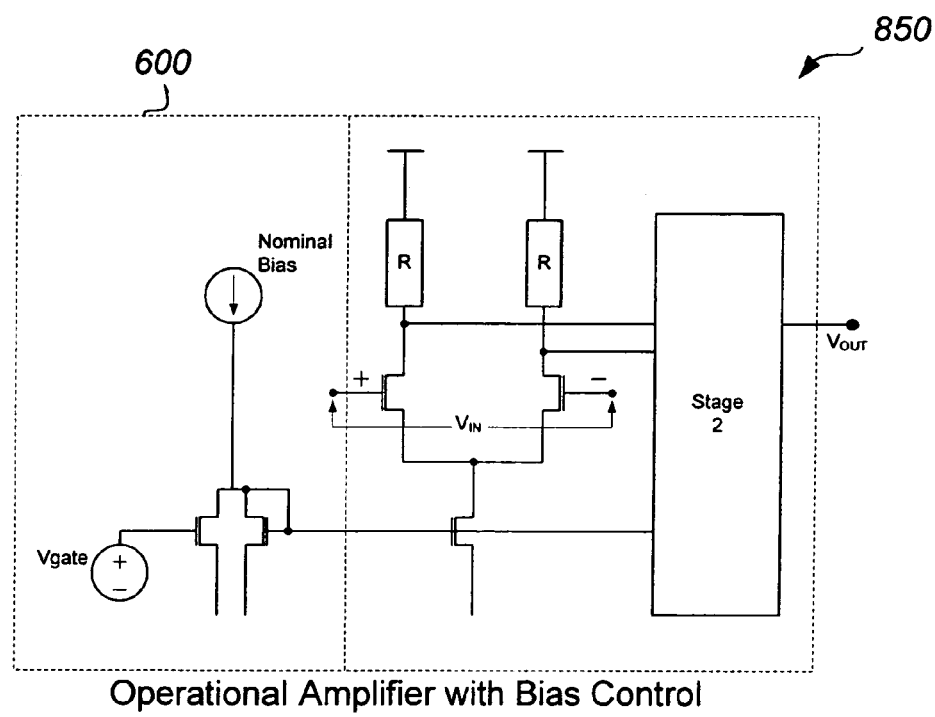
Figure 24:
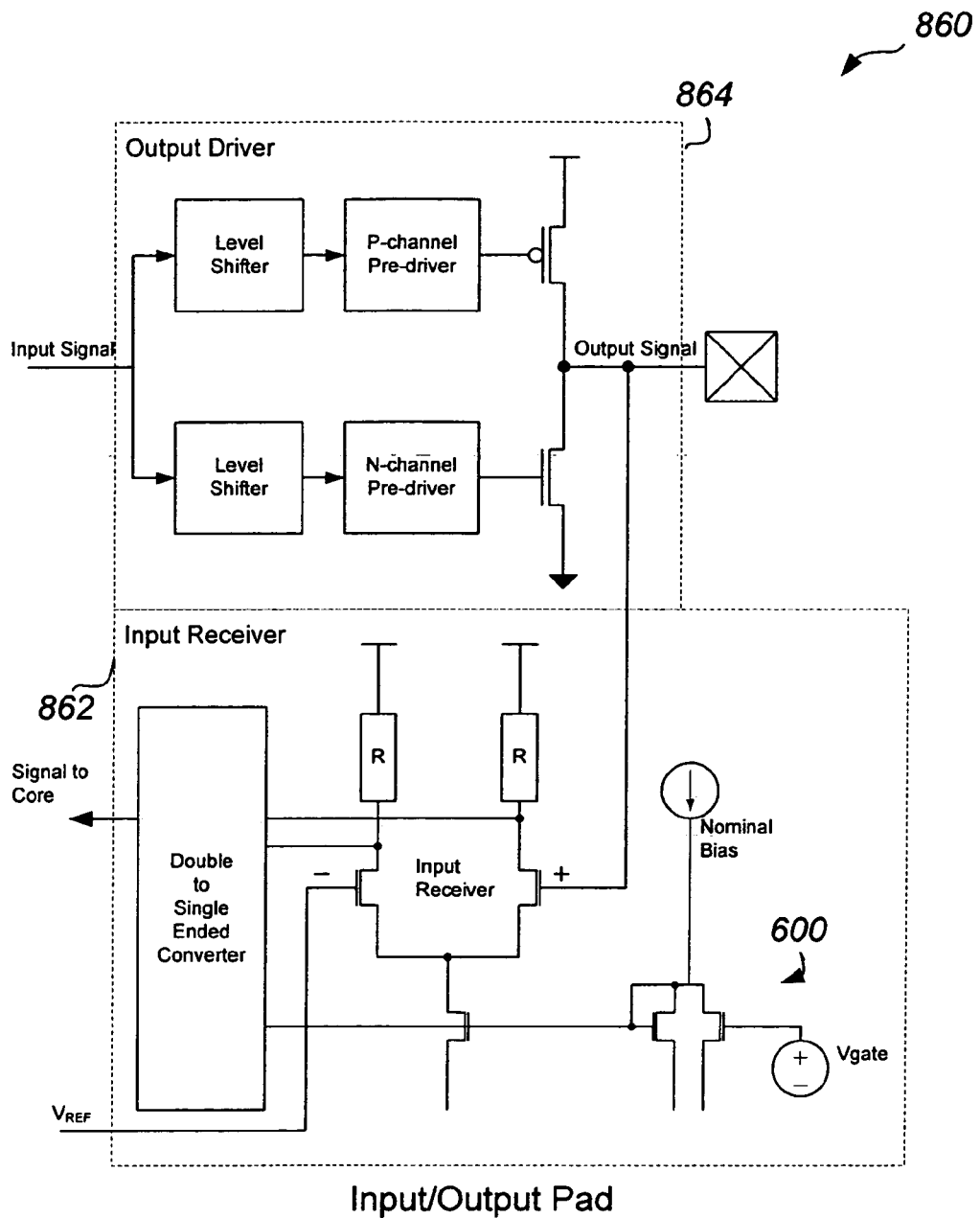
FIG. 24 is a diagram showing an Input/Output pad with the bias circuit of FIG. 17.

FIG. 19 illustrates the gate structure of the transistor 528 of FIG. 17. As described above, the gate structure of the transistors 528 includes a plurality of stripes. In FIG. 19, stripes $802_1$–$802_N$ are shown as examples. FIG. 20 illustrates a basic DLL 804 with the bias circuit 600 of FIG. 17. Referring to FIG. 20, the DLL 804 includes a phase/frequency detector 806, a loop filter 808 and a VCDL 810. The bias circuit 600 of FIG. 17 is provided to the VCDL 810. FIG. 21 illustrates a basic PLL 820 with the bias circuit 600 of FIG. 17. Referring to FIG. 21, the PLL 820 includes a phase/frequency detector 826, a charge pump circuit 828, a loop filter 830 and a Voltage Controlled Oscillator (VCO) 832 using a VCDL. The bias circuit 600 of FIG. 17 is provided to the VCO 832. FIG. 22 illustrates a charge pump with the bias circuit 600 of FIG. 17. Referring to FIG. 22, the charge pump 840 includes the bias circuit 600 of FIG. 17, a charge pump stage 842 and a loop filter 844. FIGS. 23a and 23b illustrate a basic Operational Amplifier 850 with the bias circuit 600 of FIG. 17. FIG. 24 illustrates an Input/Output pad 860 with the bias circuit 600 of FIG. 17. Referring to FIG. 24, the Input/Output pad module 860 includes an input receiver 862 and an output receiver 864. In FIG. 24, the bias circuit 600 of FIG. 17 is connected to the input receiver 862.

Similarly, a bleeder circuit using PMOS devices is used for P bias. This also has an added benefit of adjusting for odd process corners when P and N devices do not track one another (e.g., strong N, weak P and vice versa) since they are adjusted separately.

It may be understood by those skilled in the art that variations may be made to these implementations while still implementing the essential inventive concept.

What is claimed is:

1. A CMOS circuit comprising:
   a first gate reference voltage;
   a first bias circuit source; and
   a device for adjusting a current from the first bias current source to a first circuit to reduce the variation of the first circuit as a function of process, voltage and temperature, the device including:
   a first transistor having a gate, a first node and a second node, the gate of the first transistor being coupled to the first gate reference voltage, the first node of the first transistor being coupled to the first bias current source, the first transistor for generating a current sensitive to process, voltage and temperature variations;
   a second transistor coupled to the first circuit and having a gate, a first node and a second node, the gate and the first node of the second transistor being coupled to the first node of the first transistor and the first bias current source, the second transistor for adjusting a current proportional to the difference between the current generated by the first bias current source and the current from the first transistor thereby compensating the current of the first bias current source for the process, voltage and temperature variations.

2. A CMOS circuit as claimed in claim 1, wherein the structure of the gate of the first transistor includes a plurality of stripes.

3. A CMOS circuit as claimed in claim 1, wherein the first transistor and the second transistor are NMOS transistors, the first node of the first transistor being a drain, the first node of the second transistor being a drain.

4. A CMOS circuit as claimed in claim 1, wherein the first circuit includes at least one of a delay cell, a delay lock loop (DLL), a phase lock loop (PLL), a charge pump, an Operational Amplifier, and an Input/Output pad.

* * * * *